(12) United States Patent
Lee et al.

(10) Patent No.: US 9,082,868 B2
(45) Date of Patent: Jul. 14, 2015

(54) SEMICONDUCTOR COMPONENT AND METHOD OF MANUFACTURE

(71) Applicant: Semiconductor Components Industries, LLC, Phoenix, AZ (US)

(72) Inventors: Kisun Lee, Hwasungsi (KR); Michael A. Stapleton, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 13/801,026

(22) Filed: Mar. 13, 2013

(65) Prior Publication Data

US 2014/0264611 A1    Sep. 18, 2014

(51) Int. Cl.
*H01L 27/06* (2006.01)
*H01L 23/00* (2006.01)

(52) U.S. Cl.
CPC ....... *H01L 24/80* (2013.01); *H01L 2924/12032* (2013.01); *H01L 2924/1305* (2013.01); *H01L 2924/1306* (2013.01); *H01L 2924/13091* (2013.01)

(58) Field of Classification Search
CPC . H01L 24/80; H01L 27/0617; H01L 2924/00; H01L 2924/1305; H01L 2924/1306; H01L 2924/13091; H01L 2924/12032
See application file for complete search history.

(56) References Cited

U.S. PATENT DOCUMENTS

| | | | |
|---|---|---|---|
| 6,291,881 B1 | 9/2001 | Yang | |
| 7,030,317 B1 | 4/2006 | Oman | |
| 7,485,954 B2 | 2/2009 | Havanur | |
| 7,615,854 B2 | 11/2009 | Montgomery | |
| 7,977,780 B2 * | 7/2011 | Tay et al. | 257/686 |
| 2002/0195624 A1 | 12/2002 | Glenn et al. | |
| 2004/0004272 A1 | 1/2004 | Luo et al. | |
| 2004/0222433 A1 | 11/2004 | Mazzochette et al. | |
| 2005/0224945 A1 | 10/2005 | Saito et al. | |
| 2008/0217765 A1 * | 9/2008 | Yoder et al. | 257/723 |
| 2010/0133674 A1 | 6/2010 | Hebert et al. | |
| 2011/0292632 A1 * | 12/2011 | Wen et al. | 361/820 |

* cited by examiner

*Primary Examiner* — Whitney T Moore
(74) *Attorney, Agent, or Firm* — Rennie William Dover (57) ABSTRACT

A semiconductor component and a method for manufacturing the semiconductor component. In accordance with an embodiment, the semiconductor component includes a plurality of stacked semiconductor chips mounted to a support structure, wherein one semiconductor chip has a side with a plurality of electrical contacts electrically coupled to conductive tabs of the support structure. An electrical connector electrically connects an electrical contact formed from a side opposite the side with the plurality of electrical contacts to a corresponding conductive tab. Another semiconductor chip is mounted to the electrical connector and electrical contacts formed from this semiconductor chip are electrically connected to corresponding conductive tabs of the support structure.

21 Claims, 10 Drawing Sheets

SEMICONDUCTOR COMPONENT AND METHOD OF MANUFACTURE

BACKGROUND

The present invention relates, in general, to electronics and, more particularly, to methods of forming semiconductor devices and structure.

In the past, the semiconductor industry used a variety of package configurations to increase the packing density of semiconductor die in a system. The increased demand for electronic devices increased the demand for smaller, lighter, and yet more functional semiconductor devices and resulted in a demand for semiconductor packages that had increased semiconductor packaging densities with smaller outlines and mounting footprints. In some embodiments, semiconductor die were vertically stacked on top of one another with an interposing layer of adhesive attached to the semiconductor die in order to couple the semiconductor die together. The die were attached to a glass-epoxy type printed circuit board substrate or other similar substrate. The semiconductor die were then wire bonded to the substrate to form electrical interconnections between the substrate and the semiconductor die. One example of such a package configuration is disclosed in U.S. Pat. No. 6,650,019 issued to Thomas B. Glenn et al. on Nov. 18, 2003. Another example of an electronic assembly with stacked integrated circuit die is disclosed in U.S. Pat. No. 7,030,317, issued to Todd P. Oman on Apr. 18, 2006.

Accordingly, it would be advantageous to have a semiconductor component and method of stacking semiconductor die to manufacture the semiconductor component without increasing the footprint of the semiconductor component. It would be of further advantage for the semiconductor component and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally, the present invention provides a semiconductor component and a method for manufacturing the semiconductor component. In accordance with one aspect, a semiconductor chip having first and second surfaces is mounted to a support structure having a plurality of electrical conductors. The semiconductor chip may be comprised of a transistor such as, for example, a field effect transistor having source and gate contacts formed form one side of the semiconductor chip and a drain contact formed from the opposite side of the semiconductor chip. The source and gate contacts are electrically connected to corresponding electrical conductors of the support structure. The drain contact is electrically connected to another electrical conductor of the support structure through an electrical connector. A semiconductor chip is mounted and electrically connected to the electrical connector that electrically connects the drain contact to the support structure. More particularly, the semiconductor chip may be comprised of a transistor such as, for example, a field effect transistor having drain and gate contacts formed from one side of the semiconductor chip and a source contact formed from the opposite side of the semiconductor chip, wherein the source contact is electrically connected to the electrical connector that electrically couples the drain contact to the support structure. The source contact is electrically connected to a corresponding electrical conductor of the support structure and the gate contact is electrically connected to another electrical conductor of the support structure.

In accordance with another embodiment of the present invention, a support structure having a plurality of electrically conductive tabs is provided. Electrical contacts of a semiconductor chip are electrically coupled to corresponding electrically conductive tabs of the plurality of electrically conductive tabs, wherein the electrical contacts are on one side of the semiconductor chip. An electrical contact on an opposite side of the semiconductor chip is electrically connected to a corresponding electrically conductive tab of the plurality of electrically conductive tabs. An electrical contact of another semiconductor chip is electrically coupled to a corresponding electrically conductive tab of the plurality of electrically conductive tabs to form a stacked semiconductor chip. Electrical contacts on an opposite side of the stacked semiconductor chip are electrically coupled to corresponding electrically conductive tabs of the plurality of electrically conductive tabs.

It should be noted that in alternative embodiments semiconductor chip are positioned laterally adjacent each other rather than being stacked.

Figure 1:
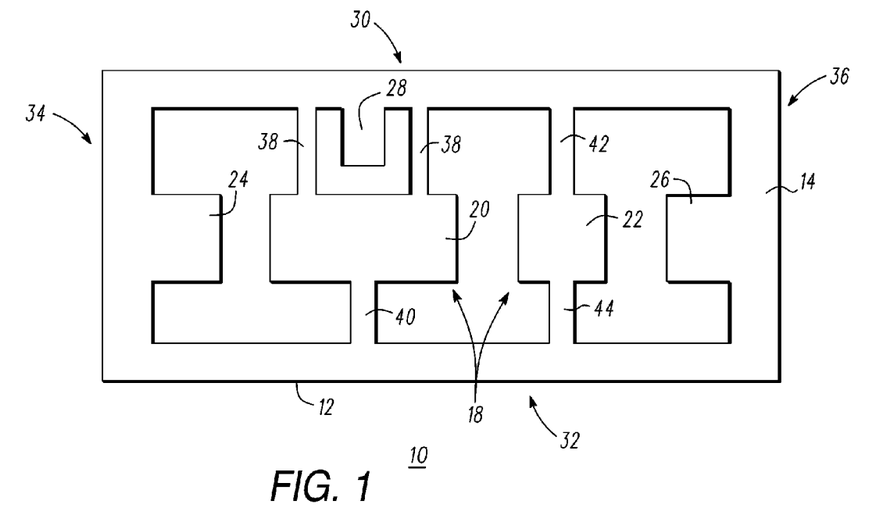
FIG. 1 is a top view of a portion of a semiconductor component in accordance with an embodiment of the present invention.

FIG. 1 is a top view of a portion of a semiconductor component 10 at an early stage of manufacture in accordance with embodiments of the present invention. What is shown in FIG. 1 is a support structure 12 such as, for example, a leadframe having a surface 14, a component receiving area 18 comprising a split-flag having a flag or die attach sub-portion 20 and another flag or die attach sub-portion 22, and leadframe leads 24, 26, and 28. More particularly, leadframe 12 has opposing rails 30 and 32 and opposing rails 34 and 36. Flag sub-portion 20 is configured to receive a portion of a semiconductor chip 48 (shown in FIGS. 2 and 3) and flag sub-portion 22 is configured to receive another portion of semiconductor chip 48 (shown in FIGS. 2 and 3). Flag sub-portion 20 has opposing sides wherein one opposing side is coupled to rail 30 via connectors 38 and the other opposing side is coupled to rail 32 via a connector 40. Flag sub-portion 22 has opposing sides wherein one opposing side is coupled to rail 30 via a connector 42 and the other opposing side is coupled to rail 32 via a connector 44. Leadframe lead 24 extends from rail 34 towards flag sub-portion 20 and leadframe lead 26 extends from rail 36 towards flag sub-portion 22. By way of example, leadframe 24 is a copper leadframe. Other suitable materials for leadframe 24 include alloys of copper, aluminum, alloys of aluminum, steel, iron, or the like. It should be noted that the configuration or shape of leadframe 12 is not a limitation. For example, flag sub-portions 20 and 22 can be shaped as squares, rectangles, triangles, or other polygons, circles, ellipses, or the like. The flag sub-portions and leadframe leads may be referred to as electrically conductive tabs or electrical conductors. It should be further noted that substrate 12 has opposing major surfaces 14 and 16, where surface 16 is shown in FIG. 3.

Figure 2:
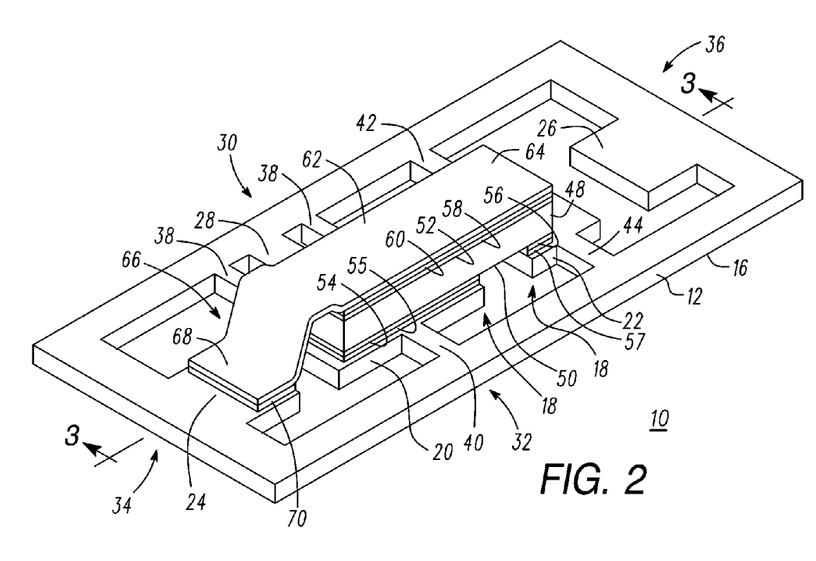
FIG. 2 is an isometric view of a portion of the semiconductor component of FIG. 1 at a later stage of manufacture in accordance with an embodiment of the present invention.
Figure 3:
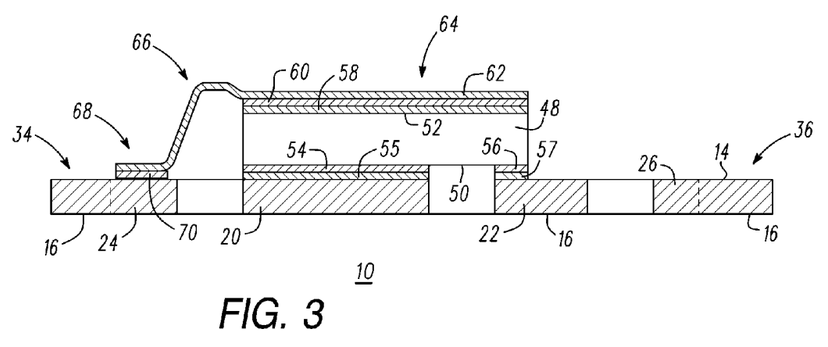
FIG. 3 is a cross-sectional view of the semiconductor component of FIG. 2 taken along section line 3-3 in accordance with an embodiment of the present invention.

FIG. 2 is an isometric view of a semiconductor component 10 shown in FIG. 1, but at a later stage of manufacture. FIG. 3 is a cross-sectional view of semiconductor component 10 taken along section line 3-3 of FIG. 2. For the sake of clarity, FIGS. 2 and 3 will be described together. What is shown in FIG. 2 is a component such as, for example, a semiconductor chip 48 mounted to leadframe 12 and an electrical connector such as, for example an electrical connector 62 coupling semiconductor chip 48 to leadframe lead 24 of leadframe 12. Semiconductor chip 48 has surfaces 50 and 52 (shown in FIG. 3) which are on opposite sides of semiconductor chip 48, wherein a source contact or source bond pad 54 is formed from or on a portion of surface 50 and a gate contact or gate bond pad 56 is formed from or on another portion of surface 50. A drain contact or drain bond pad 58 is formed from or on a portion of surface 52. Source contact 54 is bonded or attached to flag sub-portion 20 and gate contact 56 is attached to flag sub-portion 22 of leadframe 12. For example, source contact 54 may be bonded, attached, or connected to flag sub-portion 20 via an electrically and thermally conductive die attach material 55 and gate contact 56 may be bonded, attached, or connected to flag sub-portion 22 via an electrically and thermally conductive die attach material 57. Suitable die attach materials 55 and 57 include solder, an electrically conductive paste, conductive film, or the like. When the component coupled to component receiving area 18 is a semiconductor chip, component receiving area 18 may be referred to as a semiconductor chip receiving area or a chip receiving area.

An electrical connector 62 having ends 64 and 68 and a central region 66 couples drain contact 58 to leadframe lead 24 of support structure 12. End 64 may be referred to as an interposer region because it may be positioned between at least two semiconductor chips, i.e., a semiconductor chip may be positioned below interposer region 64 and another semiconductor chip may be positioned above interposer region 64. Electrical connecter 62 may be a clip, a wire, a ribbon, such as, for example, an aluminum ribbon, or the like. Ends 64 and 68 may have a rectangular shape, a square shape, a polygonal shape, a circular shape, and elliptical shape, or the like. End 68 may be bonded or connected to leadframe lead 24 through, for example, a solder layer 70 and interposer region 64 may be bonded or connected to semiconductor chip 48 through a layer of an electrically conductive material 60. By way of example, interposer region 64 is a rectangular shaped region. Suitable materials for electrical connector 62 include copper, aluminum, metals and metal alloy connectors coated with a precious metal, tin, steel, alloys of copper, beryllium, gold, silver, alloys of aluminum, brass, alloys of brass, or the like. Broken lines are shown in sides 34 and 36 of FIG. 3 to further illustrate that leadframes leads 24 and 26 extend from sides 34 and 36, respectively.

Figure 4:
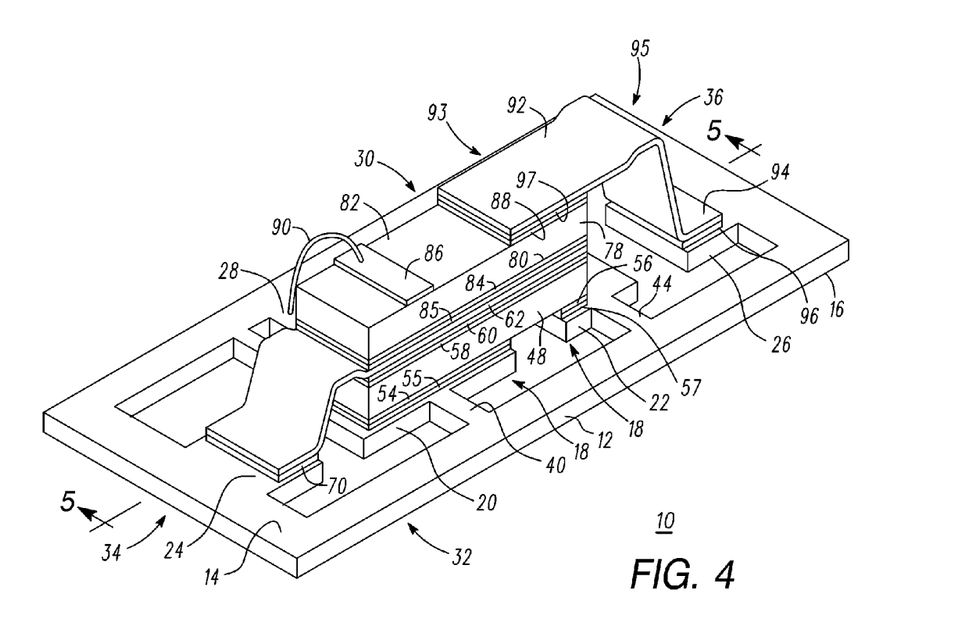
FIG. 4 is an isometric view of the semiconductor component of FIGS. 2 and 3 at a later stage of manufacture in accordance with an embodiment of the present invention.
Figure 5:
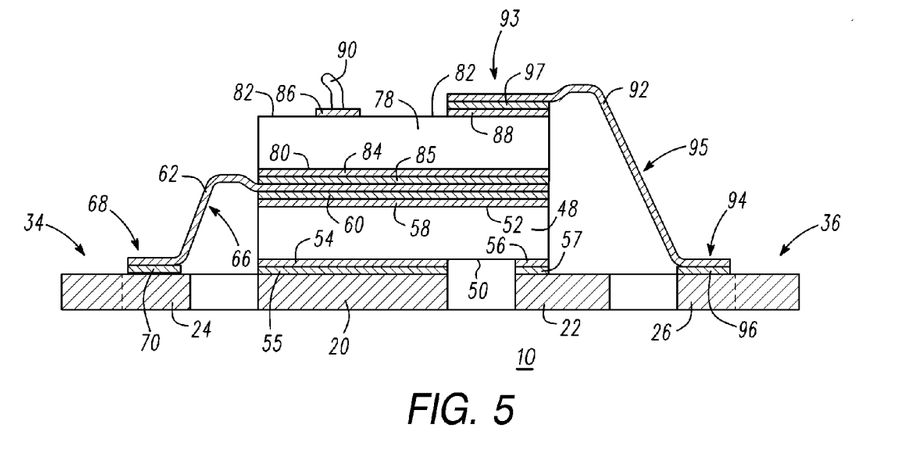
FIG. 5 is a cross-sectional view of the semiconductor component of FIG. 4 taken along section line 5-5 in accordance with an embodiment of the present invention.

FIG. 4 is an isometric view of semiconductor component 10 of FIGS. 2 and 3 at a later stage of manufacture. FIG. 5 is a cross-sectional view of semiconductor component 10 taken along section line 5-5 of FIG. 4. For the sake of clarity, FIGS. 4 and 5 will be described together. What is shown in FIG. 4 is a semiconductor chip 78 having opposing major surfaces 80 and 82 mounted to electrical connector 62. Semiconductor chip 78 is connected to interposer region 64 through an electrically conductive die attach material 85. Suitable die attach materials include solder, a conductive paste, a conductive film, or the like. Die attach materials 55, 57, and 85 may be the same as each other or they may be different from each other. Semiconductor chip 78 has a gate bond pad 86 which serves as a gate contact, a drain bond pad 88 which serves as a drain contact, and a source bond pad 84 which serves as a source contact. Gate contact 86 may be connected to leadframe lead 28 by a bond wire 90 and drain contact 88 may be connected to drain leadframe lead 26 by an electrical connector 92, which has ends 93 and 94 and a central region 95. End 93 may be referred to as an interposer region because it may be positioned vertically between at least two semiconductor chips, i.e., a semiconductor chip may be positioned below interposer region 93 and another semiconductor chip may be positioned above interposer region 93. Electrical connecter 92 may be a clip, a wire, a ribbon, such as, for example, an aluminum ribbon, or the like. End 94 is bonded to leadframe lead 26 through, for example, a solder layer 96 and interposer region 93 may be connected to semiconductor chip 78 by a layer of an electrically conductive material 97. By way of example, interposer region 93 is a rectangular shaped region. Suitable materials for electrical connector 92 include copper, aluminum, metals and metal alloy connectors coated with a precious metal, tin, steel, alloys of copper, beryllium, gold, silver, alloys of aluminum, brass, alloys of brass, or the like.

Figure 6:
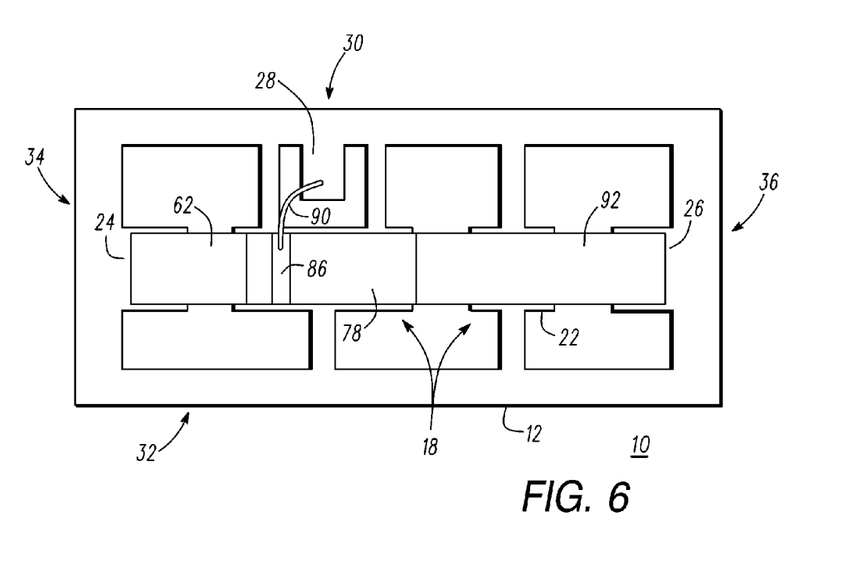
FIG. 6 is a top view of the semiconductor component of FIG. 4 in accordance with an embodiment of the present invention.

FIG. 6 is a top view of semiconductor component 10 of FIG. 5 further illustrating bond wire 90 electrically coupling gate contact 86 to leadframe lead 28.

Figure 7:
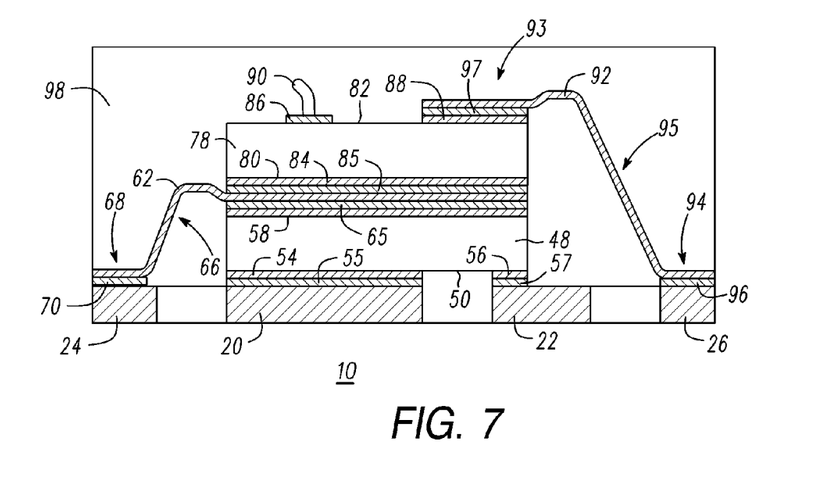
FIG. 7 is a cross-sectional view of the semiconductor component of FIG. 5 at a later stage of manufacture in accordance with an embodiment of the present invention.

FIG. 7 is a cross-sectional side view of semiconductor component 10 after singulation and encapsulation by, for example, a mold compound 98.

Figure 8:
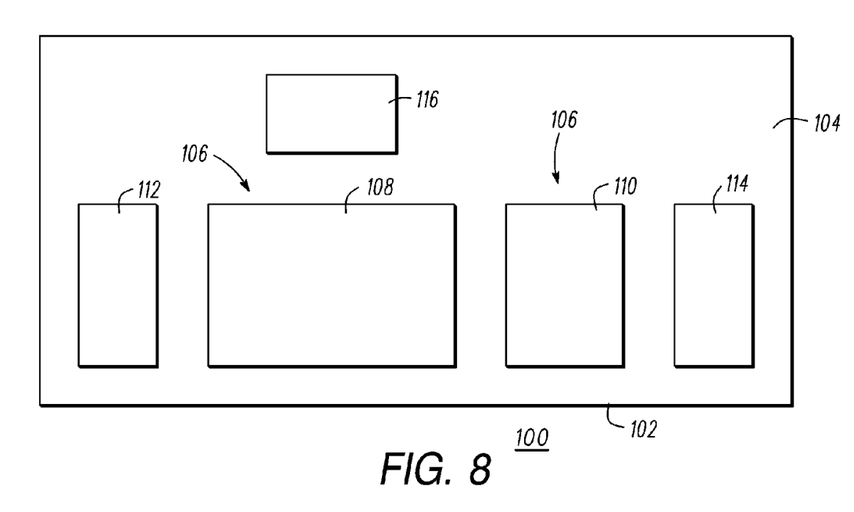
FIG. 8 is a plan view of a portion of a semiconductor component in accordance with embodiments of the present invention.

FIG. 8 is a top view of a portion of a semiconductor component 100 at an early stage of manufacture in accordance with another embodiment of the present invention. What is shown in FIG. 8 is a support structure 102 such as, for example, a printed circuit board having a surface 104, a component receiving area 106 comprising a component contact structure or die attach sub-portion 108 formed in a portion of component receiving area 106, a component contact structure or die attach sub-portion 110 formed in another portion of component receiving area 106, and bond pads 112, 114, and 116. By way of example, die attach sub-portion 108 may be configured for electrical connection to a source contact of a semiconductor chip; die attach sub-portion 110 may be configured for electrical connection to a gate contact of a semiconductor chip, bond pad 112 may serve as a bond pad for connection to the drain and source electrodes of a plurality of semiconductor chips and may be referred to as a source/drain bond pad; bond pad 114 may serve as a bond pad for connection to a drain electrode and bond pad 116 may serve as a gate bond pad for electrical connection to a gate electrode and may be referred to as a gate bond pad. It should be noted that substrate 102 has opposing major surfaces 104 and 105, where surface 105 is shown in FIGS. 9 and 10.

Die attach portions 108 and 110, and bond pads 112, 114, and 116 may be referred to as electrically conductive tabs or electrical conductors and may be comprised of metallization systems that include one or more layers of an electrically conductive material. Suitable metals for the metallization systems of die attach portions 108 and 110, and bond pads 112, 114, and 116 include copper, aluminum, alloys of aluminum, combinations thereof, or the like. Alternatively, support structure 102 can be a ceramic substrate, a structure comprising a resin, such as epoxy, polyimide, triazine, or a phenolic resin, an epoxy-glass composite, or the like. The layout or positioning of bond pads on support substrate 102 is not a limitation of the present invention.

Figure 9:
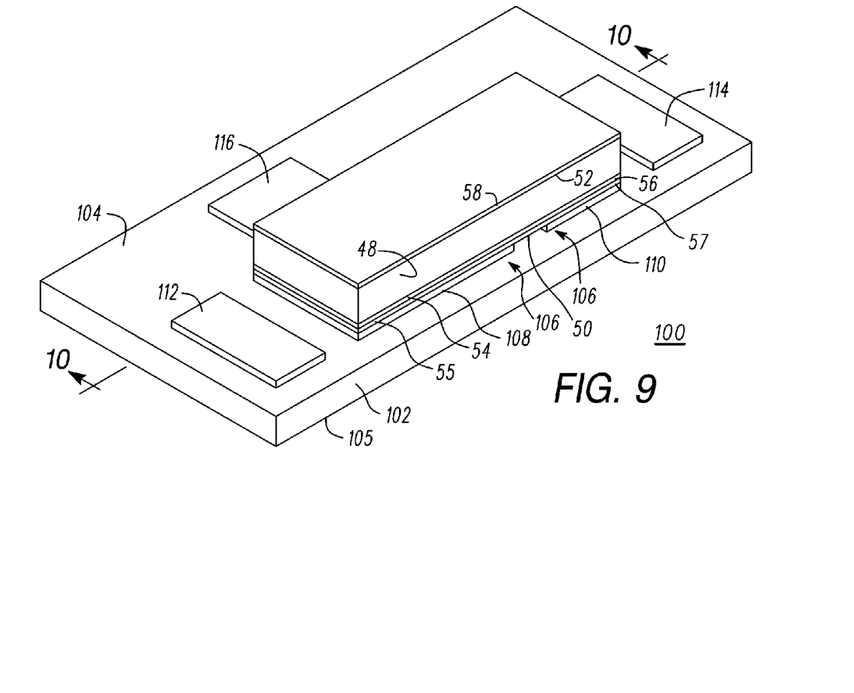
FIG. 9 is an isometric view of a portion of a semiconductor component of FIG. 8 in accordance with an embodiment of the present invention.
Figure 10:
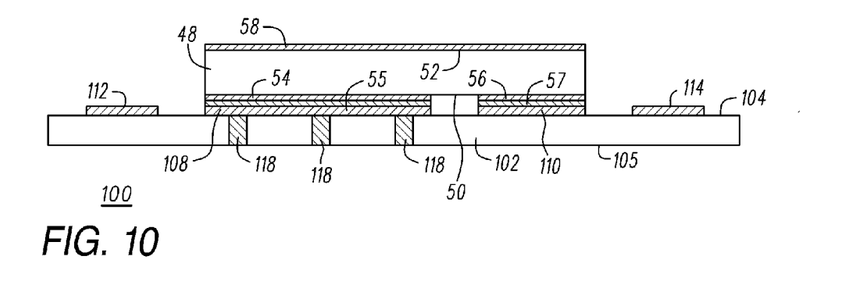
FIG. 10 is a cross-sectional view of the semiconductor component of FIG. 9 taken along section line 10-10 in accordance with an embodiment of the present invention.

FIG. 9 is an isometric view of a semiconductor component 100 shown in FIG. 8, but at a later stage of manufacture. FIG. 10 is a cross-sectional view of semiconductor component 100 taken along section line 10-10 of FIG. 9. For the sake of clarity, FIGS. 9 and 10 will be described together. A component such as, for example, semiconductor chip 48 is mounted to die attach pads 108 and 110 in component receiving area 106. Semiconductor chip 48 may be mounted to component receiving area 106 by attaching or bonding source contact 54 to die attach portion 108 using die attach material 55 and attaching or bonding gate contact 56 to die attach portion 110 using die attach material 57. Semiconductor chip 48 and die attach materials 55 and 57 have been described with reference to FIG. 2. When the component coupled to component receiving area 106 is a semiconductor chip, component receiving area 106 may be referred to as a semiconductor chip receiving area or a chip receiving area. FIG. 10 further illustrates heat conductors 118 that connect source contact 108 to surface 105 for removal of heat from components mounted on or over component contact structure 102.

Figure 11:
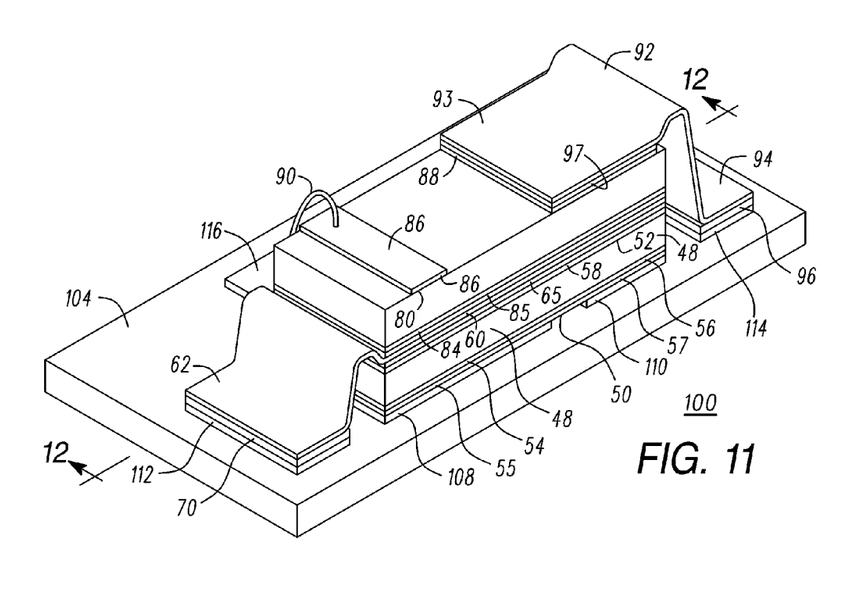
FIG. 11 is an isometric view of a portion of the semiconductor component of FIGS. 9 and 10 in accordance with an embodiment of the present invention.
Figure 12:
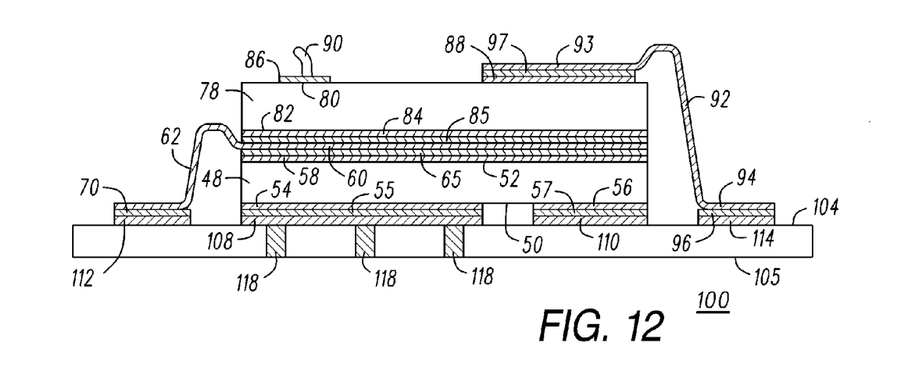
FIG. 12 is a cross-sectional view of the semiconductor component of FIG. 11 taken along section line 12-12 in accordance with an embodiment of the present invention.

FIG. 11 is an isometric view of semiconductor component 100 of FIGS. 9 and 10 at a later stage of manufacture. FIG. 12 is a cross-sectional view of semiconductor component 100 taken along section line 12-12 of FIG. 11. For the sake of clarity, FIGS. 11 and 12 will be described together. What is shown in FIG. 11 is electrical connector 62 having ends 64 and 68 and a central region 66 coupling drain contact 58 to bond pad 112 of support structure 102. End 64 may be referred to as an interposer region because it may be positioned between at least two semiconductor chips, i.e., a semiconductor chip may be positioned below interposer region 64 and another semiconductor chip may be positioned above interposer region 64. Electrical connecter 62 may be a clip, a wire, a ribbon, such as, for example, an aluminum ribbon, or the like. End 68 is bonded to bond pad 112 through, for example, a solder layer 70 and interposer region 64 may be connected to semiconductor chip 48 by a layer of an electrically conductive material 65. Suitable materials for electrical connector 62 include copper, aluminum, metals and metal alloy connectors coated with a precious metal, tin, steel, alloys of copper, beryllium, gold, silver, alloys of aluminum, brass, alloys of brass, or the like. Electrical connector 62 has been described with reference to FIG. 3.

A semiconductor chip 78 having opposing surfaces 80 and 82 is mounted to electrical connector 62. Source contact 84 of semiconductor chip 78 is connected to interposer region 64 through an electrically conductive die attach material 85. Suitable die attach materials include solder, a conductive paste, a conductive film, or the like. Die attach materials 55, 57, and 85 have been described with reference to FIGS. 2-5. Semiconductor chip 78 has been described with reference to FIGS. 4 and 5. Gate contact 86 is connected to bond pad 116 by a bond wire 90 and drain contact 88 is connected to drain bond pad 114 by electrical connector 92, which has ends 93 and 94 and a central region 95. Electrical connecter 92 has been described with reference to FIGS. 4 and 5. End 94 may be bonded or connected to drain bond pad 114 through, for example, a solder layer 96 and interposer region 93 may be bonded or connected to semiconductor chip 78 by a layer of electrically conductive material 97.

Figure 13:
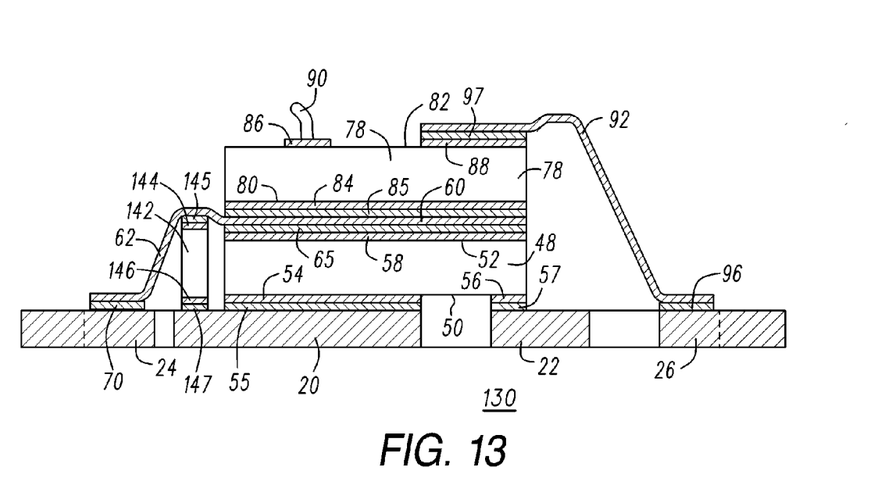
FIG. 13 is a cross-sectional view of a semiconductor component in accordance with another embodiment of the present invention.

FIG. 13 is a cross-sectional view of a semiconductor component 130 in accordance with another embodiment of the present invention. Semiconductor component 130 is similar to semiconductor components 10 and 100 except that an electrical device 142 having contacts 144 and 146 is electrically connected between conductor 62 and flag sub-portion 20 via electrically conductive adhesive material 145 and 147, respectively. Electrical device 142 may be a passive circuit element such as, for example, a capacitor, a resistor, or an inductor, or it may be an active circuit element such as, for example, a diode, a Schottky diode, a discrete semiconductor device such as, for example, a field effect transistor, a bipolar transistor, an insulated gate bipolar transistor, or the like, or an integrated circuit such as, for example, a controller or a driver. It should be noted that the support structure to which circuit elements 48, 78, and 142 contact or are bonded to is not limited to being a leadframe. Alternatively, the support structure can be a ceramic substrate, a structure comprising a resin, such as epoxy, polyimide, triazine, or a phenolic resin, an epoxy-glass composite, or the like.

Figure 14:
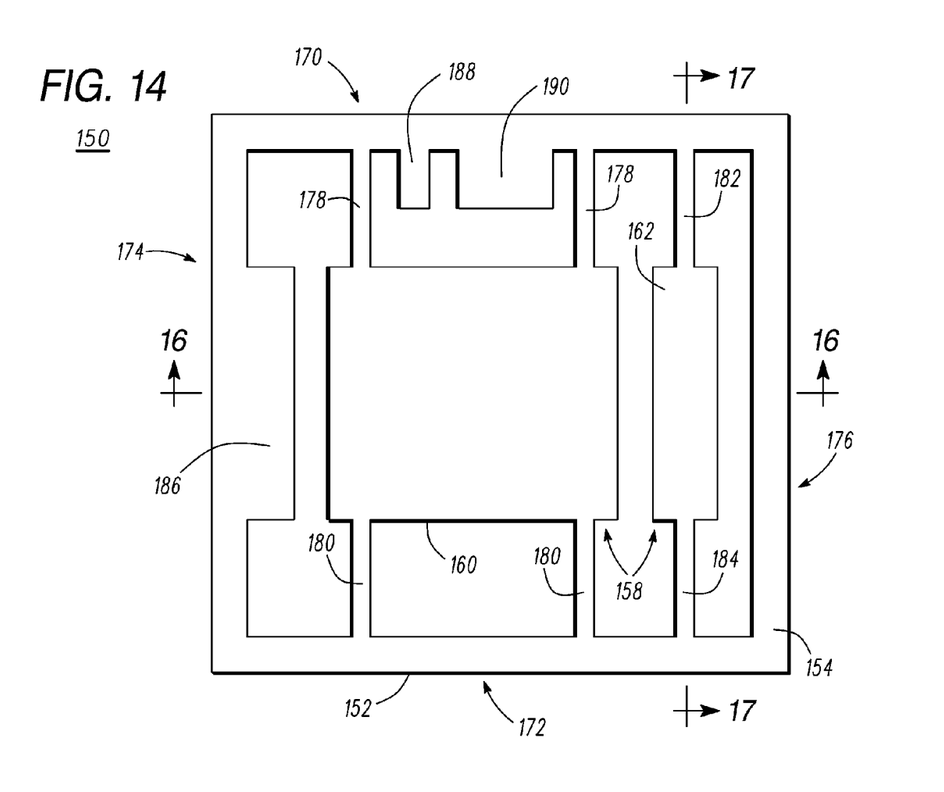
FIG. 14 is a top view of a portion of a semiconductor component in accordance with another embodiment of the present invention.
Figure 16:
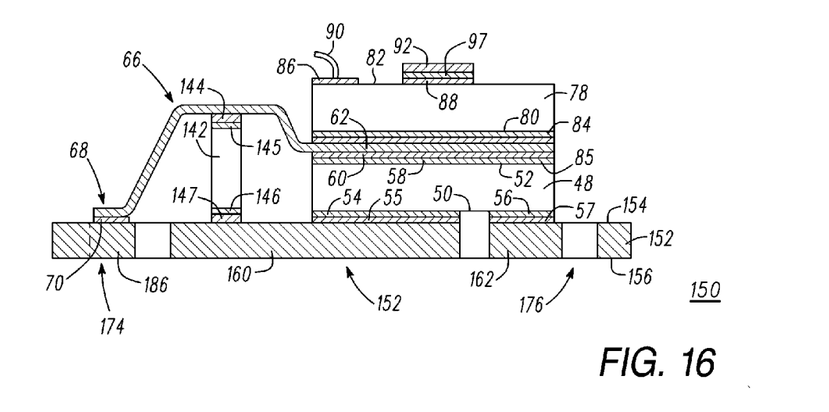
FIG. 16 is a cross-sectional view of the semiconductor component of FIG. 15 taken along section line 16-16 in accordance with an embodiment of the present invention.

FIG. 14 is a top view of a portion of a semiconductor component 150 at an early stage of manufacture in accordance with another embodiment of the present invention. What is shown in FIG. 14 is a support structure 152 such as, for example, a leadframe having a surface 154, a component receiving area 158 comprising a split-flag having a flag or die attach sub-portion 160 and another flag or die attach sub-portion 162, and leadframe leads 186, 188, and 190. More particularly, leadframe 152 has opposing rails 170 and 172 and opposing rails 174 and 176. Flag sub-portion 160 is configured to receive a portion of a semiconductor chip and flag sub-portion 162 is configured to receive another portion of the semiconductor chip. Flag sub-portion 160 has opposing sides wherein one opposing side is coupled to rail 170 via connectors 178 and the other opposing side is coupled to rail 172 via connectors 180. Flag sub-portion 162 has opposing sides wherein one opposing side is coupled to rail 170 via a connector 182 and the other opposing side is coupled to rail 172 via a connector 184. Leadframe lead 186 extends from rail 174 towards flag sub-portion 160, leadframe lead 188 extends from a portion of rail 170 towards flag sub-portion 160, and leadframe lead 190 extends from another portion of rail 170 towards flag sub-portion 160. By way of example, leadframe 152 is a copper leadframe. Other suitable materials for leadframe 152 include alloys of copper, aluminum, alloys of aluminum, steel, iron, or the like. It should be noted that the configuration or shape of leadframe 152 is not a limitation. For example, flag sub-portions 160 and 162 can be shaped as squares, rectangles, triangles, or other polygons, circles, ellipses, or the like. It should be noted that substrate 152 has opposing major surfaces 154 and 156, where surface 156 is shown in FIG. 16.

Figure 15:
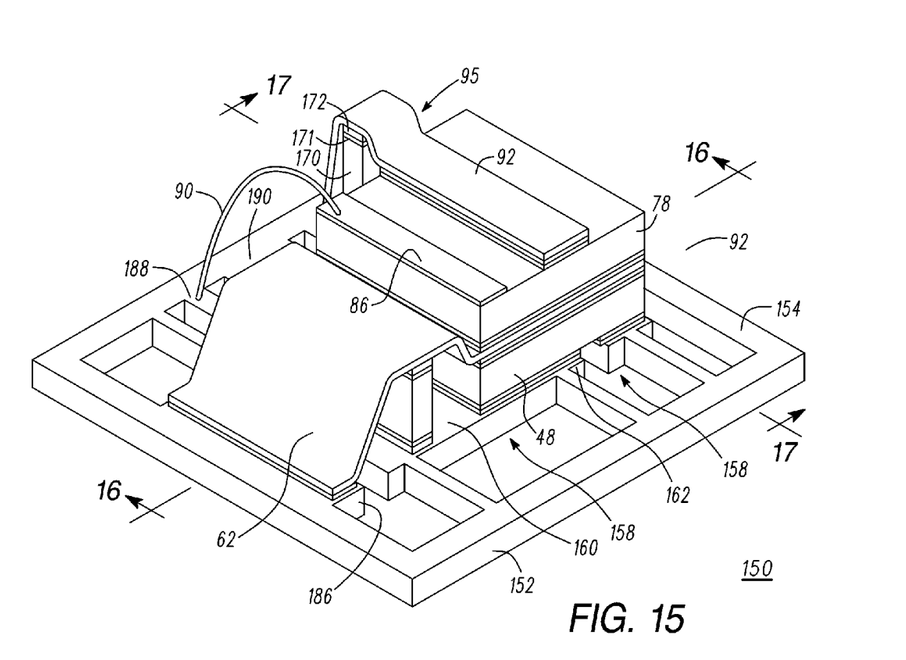
FIG. 15 is an isometric view of a portion of the semiconductor component of FIG. 14 in accordance with an embodiment of the present invention.
Figure 17:
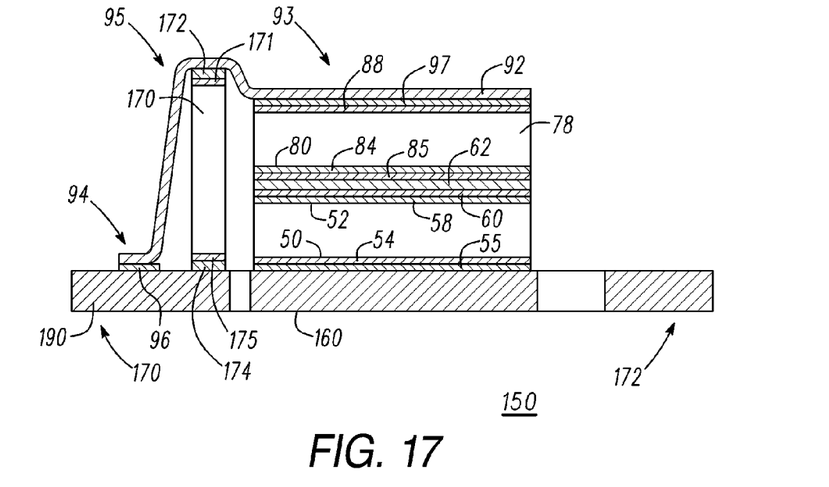
FIG. 17 is a cross-sectional view of the semiconductor component of FIG. 15 taken along section line 17-17 in accordance with an embodiment of the present invention.

FIG. 15 is an isometric view of a semiconductor component 150 shown in FIG. 14, but at a later stage of manufacture. FIG. 16 is a cross-sectional view of semiconductor component 150 taken along section line 16-16 of FIG. 15. FIG. 17 is a cross-sectional view of semiconductor component 150 taken along section line 17-17 of FIG. 15. For the sake of clarity, FIGS. 15, 16, and 17 will be described together. What is shown in FIG. 15 is a component such as, for example, a semiconductor chip 48 mounted to leadframe 152 and an electrical connector such as, for example an electrical connector 62 coupling semiconductor chip 48 to leadframe lead 186 of leadframe 152. Semiconductor chip 48 has surfaces 50 and 52 (shown in FIG. 3) which are on opposite sides of semiconductor chip 48, wherein a source contact or source bondpad 54 is formed from or on a portion of surface 50 and a gate contact or gate bondpad 56 is formed from or on another portion of surface 50. A drain contact or drain bondpad 58 is formed from or on a portion of surface 52. Source contact 54 is bonded or attached to flag sub-portion 160 and gate contact 56 is attached to flag sub-portion 162 of leadframe 152. For example, source contact 54 may be bonded, attached, or connected to flag sub-portion 160 via an electrically and thermally conductive die attach material 55 and gate contact 56 may be bonded, attached, or connected to flag sub-portion 162 via an electrically and thermally conductive die attach material 57. Suitable die attach materials 55 and 57 include solder, an electrically conductive paste, a conductive film, or the like. When the component coupled to component receiving area 158 is a semiconductor chip, component receiving area 158 may be referred to as a semiconductor chip receiving area or a chip receiving area.

An electrical connector 62 having ends 64 and 68 and a central region 66 couples drain contact 58 to leadframe lead 186 of support structure 152. Electrical connector 62 has been described with reference to FIGS. 2 and 3. End 68 of connector 62 may be bonded to leadframe lead 186 through, for example, a solder layer 70 and interposer region 64 of connector 62 may be connected drain contact or drain bond pad 58 of semiconductor chip 48 through a layer of an electrically conductive material material 60. Broken lines are shown in side 174 to further illustrate that leadframe lead 186 extends from side 174.

A semiconductor chip 78 having opposing surfaces 80 and 82 is mounted to electrical connector 62. Semiconductor chip 78 has a source contact or source bond pad 84 connected to interposer region 64 through an electrically conductive die attach material 85. Suitable die attach materials include solder, a conductive paste, a conductive film, or the like. Semiconductor chip 78 has a source bond pad 84 which serves as a source contact, a gate bond pad 86 which serves as a gate contact, and a drain bond pad 88 which serves as a drain contact. Gate contact 86 may be connected to leadframe lead 188 by a bond wire 90 and drain contact 88 may be connected to source leadframe lead 190 by an electrical connector 92, which has ends 93 and 94 and a central region 95. Electrical connector 92 has been described with reference to FIGS. 5 and 6. End 94 is bonded to leadframe lead 190 through, for example, a solder layer 96 and interposer region 93 may be connected to semiconductor chip 78 by a layer of an electrically conductive material 97.

An electrical device 142 having contacts 144 and 146 is electrically connected between conductor 62 and flag sub-portion 160. By way of example, electrical contact 144 is attached or bonded to electrical connector 62 via an electrically conductive material 145 and electrical contact 146 is electrically connected to flag sub-portion 160 via an electrically conductive adhesive 147. Electrical device 142 may be a passive circuit element such as, for example, a capacitor, a resistor, or an inductor, or it may be an active circuit element such as, for example, a diode, a Schottky diode, a discrete semiconductor device such as, for example, a field effect transistor, a bipolar transistor, an insulated gate bipolar transistor, or the like, or an integrated circuit. An electrical device 170 having electrical contacts 171 and 175 is electrically connected between electrical connector 92 and leadframe lead 190. By way of example, electrical contact 171 is attached or bonded to electrical connector 92 via an electrically conductive material 172 and electrical contact 175 is electrically connected to leadframe lead 190 via an electrically conductive adhesive 174. Electrical device 170 may be a passive circuit element such as, for example, a capacitor, a resistor, or an inductor, or it may be an active circuit element such as, for example, a diode, a Schottky diode, a discrete semiconductor device such as, for example, a field effect transistor, a bipolar transistor, an insulated gate bipolar transistor, or the like, or an integrated circuit such as, for example, a controller or a driver. It should be noted that the support structure to which circuit elements 48, 78, 142, and 170 are attached is not limited to being a leadframe. Alternatively, the support structure can be a ceramic substrate, a structure comprising a resin, such as epoxy, polyimide, triazine, or a phenolic resin, an epoxy-glass composite, or the like.

Figure 18:
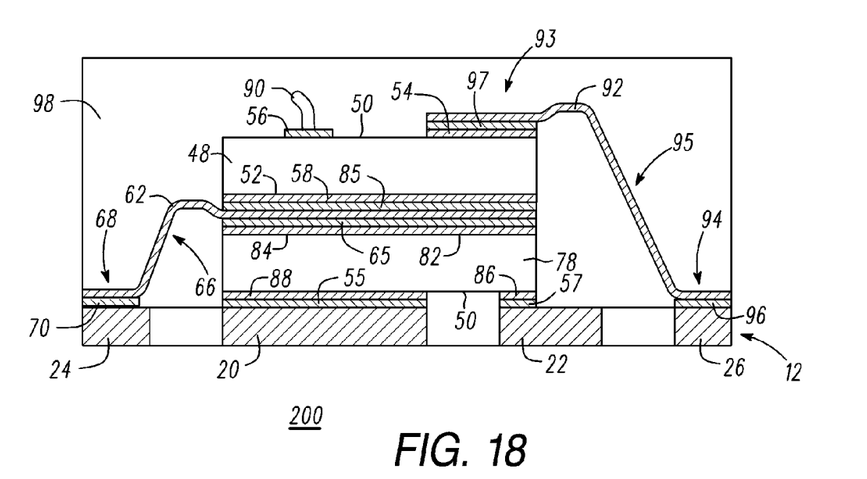
FIG. 18 is a cross-sectional view of a semiconductor component in accordance with another embodiment of the present invention.

FIG. 18 is a cross-sectional view of a semiconductor component 200 in accordance with another embodiment of the present invention. What is shown in FIG. 18 is a component such as, for example, semiconductor chip 78 mounted to leadframe 12 and an electrical connector such as, for example electrical connector 62 coupling semiconductor chip 78 to leadframe lead 24 of leadframe 12. As discussed with reference to FIGS. 4 and 5, semiconductor chip 78 has surfaces 80 and 82 (shown in FIG. 5) which are on opposite sides of semiconductor chip 78, wherein a drain contact or drain bond pad 88 is formed from or on a portion of surface 82 and a gate contact or gate bond pad 86 is formed from or on another portion of surface 82. A source contact or source bond pad 84 is formed from or on a portion of surface 80. Drain contact 84 is bonded or attached to flag sub-portion 20 and gate contact 86 is bonded or attached to flag sub-portion 22 of leadframe 12. For example, drain contact 84 may be bonded, attached, or connected to flag sub-portion 20 via an electrically and thermally conductive die attach material 55 and gate contact 86 may be bonded, attached, or connected to flag sub-portion 22 via an electrically and thermally conductive die attach material 57. Die attach materials 55 and 57 have been discussed with reference to FIGS. 2 and 3.

An electrical connector 62 connects source contact 84 to leadframe lead 24 of support structure 12. Electrical connector 62 has been described with reference to FIG. 2. End 64 may be positioned between at least two semiconductor chips, i.e., a semiconductor chip may be positioned below interposer region 64 and another semiconductor chip may be positioned above interposer region 64. End 68 may be bonded to leadframe lead 24 through, for example, a solder layer 70 and interposer region 64 may be connected to semiconductor chip 78 through a layer of an electrically conductive material 65. By way of example, interposer region 64 is a rectangular shaped region.

FIG. 18 further illustrates semiconductor chip 48 mounted to electrical connector 62. Drain contact 58 of semiconductor chip 48 is connected to interposer region 64 through an electrically conductive die attach material 85. Gate contact 56 of semiconductor chip 48 may be connected to a leadframe lead, such as for example leadframe lead 28 shown in FIG. 1 by a bond wire 90 and source contact 54 may be connected to leadframe lead 26 by electrical connector 92, which electrical interconnector 92 has been described with reference to FIG. 4. End 94 of electrical connector 92 is bonded to leadframe lead 26 through, for example, a solder layer 96 and interposer region 93 may be connected to source contact 54 of semiconductor chip 48 by layer of electrically conductive material 97. Semiconductor chips 48 and 78 are protected by mold compound 98.

Figure 19:
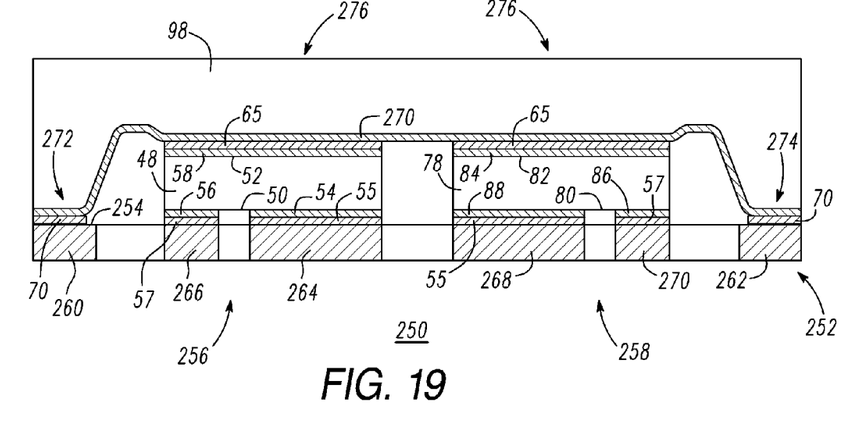
FIG. 19 is a cross-sectional view of a semiconductor component in accordance with another embodiment of the present invention.

FIG. 19 is a cross-sectional view of a semiconductor component 250 in accordance with another embodiment of the present invention. What is shown in FIG. 19 is a support structure 252 such as, for example, a leadframe having a surface 254, component receiving areas 256 and 258, and leadframe leads 260 and 262. Component receiving area 256 includes a split-flag having a flag or die attach sub-portion 264 and another flag or die attach sub-portion 266 and component receiving area 258 includes a split-flag having a flag or die attach sub-portion 268 and another flag or die attach sub-portion 270. By way of example, leadframe 252 is a copper leadframe. Other suitable materials for leadframe 252 include alloys of copper, aluminum, alloys of aluminum, steel, iron, or the like. It should be noted that the configuration or shape of leadframe 252 is not a limitation. For example, flag sub-portions 264, 266, 268, and 270 can be shaped as squares, rectangles, triangles, or other polygons, circles, ellipses, or the like. Support structure 252 is not limited to being a leadframe. Alternatively, support structure 252 can be a printed circuit board, a ceramic substrate, a structure comprising a resin, such as epoxy, polyimide, triazine, or a phenolic resin, an epoxy-glass composite, or the like.

Flag sub-portion 264 is configured to receive a portion of a semiconductor chip 48 and flag sub-portion 266 is configured to receive another portion of semiconductor chip 48. Similarly, flag sub-portion 268 is configured to receive a portion of a semiconductor chip 78 and flag sub-portion 270 is configured to receive another portion of semiconductor chip 78. Semiconductor chips 48 and 78 have been discussed previously. Source contact 54 is bonded or attached to flag sub-portion 264 and gate contact 56 is attached to flag sub-portion 266 of leadframe 252. For example, drain contact 54 may be bonded, attached, or connected to flag sub-portion 264 via an electrically and thermally conductive die attach material 55 and gate contact 56 may be bonded, attached, or connected to flag sub-portion 266 via an electrically and thermally conductive die attach material 57. Suitable die attach materials 55 and 57 include solder, an electrically conductive paste, conductive film, or the like.

Drain contact 88 is bonded or attached to flag sub-portion 268 and gate contact 86 is attached to flag sub-portion 270 of leadframe 252. For example, drain contact 88 may be bonded, attached, or connected to flag sub-portion 268 via an electrically and thermally conductive die attach material 55 and gate contact 86 may be bonded, attached, or connected to flag sub-portion 270 via an electrically and thermally conductive die attach material 57. Suitable die attach materials 55 and 57 include solder, an electrically conductive paste, conductive film, or the like.

An electrical connector 270 having ends 272 and 274 and a central region 276 couples drain contact 58 and source contact 84 to each other and to leadframe leads 260 and 262 of support structure 252. Electrical connecter 270 may be a clip, a wire, a ribbon, such as, for example, an aluminum ribbon, or the like. Ends 272 and 274 may have rectangular shapes, square shapes, polygonal shapes, circular shapes, elliptical shapes, or the like. End 272 may be bonded to leadframe lead 260 through, for example, a solder layer 70, end 274 may be bonded to leadframe lead 262 through, for example, another solder layer 70, and central region 276 may be bonded to drain contact 58 and source contact 84 through solder layers 65. Suitable materials for electrical connector 270 include copper, aluminum, metals and metal alloy connectors coated with a precious metal, tin, steel, alloys of copper, beryllium, gold, silver, alloys of aluminum, brass, alloys of brass, or the like.

Semiconductor chips 48 and 78 are protected by mold compound 98.

Figure 20:
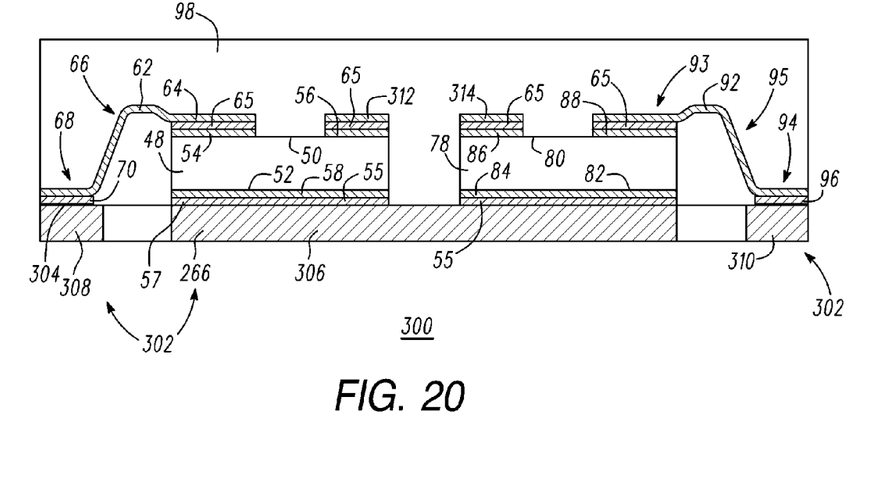
FIG. 20 is a cross-sectional view of a semiconductor component in accordance with another embodiment of the present invention.

FIG. 20 is a cross-sectional view of a semiconductor component 300 in accordance with another embodiment of the present invention. What is shown in FIG. 20 is a support structure 302 such as, for example, a leadframe having a surface 304, component receiving area 306, and leadframe leads 308 and 310. Component receiving area 306 may be a leadframe flag. By way of example, leadframe 302 is a copper leadframe. Other suitable materials for leadframe 302 include alloys of copper, aluminum, alloys of aluminum, steel, iron, or the like. It should be noted that the configuration or shape of leadframe 302 is not a limitation. For example, flag 306 can be shaped as a square, a rectangle, a triangle, or other polygonal shape, a circle, an ellipse, or the like.

Flag 306 is configured to receive semiconductor chips 48 and 78. Drain contact 58 of semiconductor chip 48 is bonded or attached to flag 306 and source contact 84 is bonded or attached to flag 306 via an electrically and thermally conductive die attach material 55.

End 64 of electrical connector 62 is attached or bonded to source contact 54 via electrically conductive die attach material 65 and end 68 of electrical connector 62 is attached or bonded to leadframe lead 308 through electrically conductive die attach material 70. End 93 of electrical connector 92 is attached or bonded to drain contact 88 via electrically conductive die attach material 65 and end 94 of electrical connector 92 is attached or bonded to leadframe lead 310 through electrically conductive die attach material 96. An electrical connector 312 is attached or bonded to gate contact 56 through electrically conductive die attach material 65 and an electrical connector 314 is attached to or bonded to gate contact 86 through electrically conductive die attach material 65. Electrical connectors 312 and 314 may be connected to leadframe flags (not shown). Examples of the leadframe flags to which 312 and 314 may be bonded include leadframe flags 188 and 190 shown in FIG. 14. Suitable materials for electrical connectors 312 and 314 include copper, aluminum, metals and metal alloy connectors coated with a precious metal, tin, steel, alloys of copper, beryllium, gold, silver, alloys of aluminum, brass, alloys of brass, or the like. Support structure 252 is not limited to being a leadframe. Alternatively, support structure 252 can be a printed circuit board, a ceramic substrate, a structure comprising a resin, such as epoxy, polyimide, triazine, or a phenolic resin, an epoxy-glass composite, or the like.

Semiconductor chips 48 and 78 are protected by mold compound 98.

By now it should be appreciated that a semiconductor component and a method for manufacturing the semiconductor component have been provided. In accordance with embodiments of the present invention, semiconductor die having, for example, power Metal Oxide Semiconductor Field Effect Transistors (MOSFETs) are formed in a stacked configuration. Thus, a plurality of stacked semiconductor die are packaged in a protective material such as, for example, a mold compound. An advantage of manufacturing semiconductor components in accordance with embodiments of the present invention is that it allows stacking semiconductor die, which decreases the footprint of the packaged semiconductor die. Alternatively, the semiconductor die may be configured or positioned laterally adjacent to each other.

Although specific embodiments have been disclosed herein, it is not intended that the invention be limited to the disclosed embodiments. Those skilled in the art will recognize that modifications and variations can be made without departing from the spirit of the invention. For example, circuit element 142 may be absent from semiconductor component 150. It is intended that the invention encompass all such modifications and variations as fall within the scope of the appended claims.

What is claimed is:

1. A semiconductor component, comprising:
   a support structure having at least first, second, third, fourth, and fifth electrically conductive tabs;
   a first semiconductor chip having first and second sides, wherein first and second electrical contacts are formed on the first side of the first semiconductor chip and a third electrical contact is formed on the second side of the first semiconductor chip, the first electrical contact directly coupled to the first electrically conductive tab and the second electrical contact directly coupled to the second electrically conductive tab;
   a first electrical connector having first and second ends, the first end of the first electrical connector directly coupled to the third electrically conductive tab and the second end of the first electrical connector directly coupled to the third electrical contact of the first semiconductor chip; and
   a second semiconductor chip having first and second sides, wherein first and second electrical contacts are formed on the first side of the second semiconductor chip and a third electrical contact is formed on the second side of the second semiconductor chip, the third electrical contact of the second semiconductor chip directly coupled to the second end of the first electrical connector, the first electrical contact of the second semiconductor chip electrically coupled to the fourth electrically conductive tab and the second electrical contact of the second semiconductor chip electrically coupled to the fifth electrically conductive tab.

2. The semiconductor component of claim 1, wherein the first and second electrically conductive tabs are first and second die attach portions of a leadframe and the third and fourth electrically conductive tabs are first and second leadframe leads of the leadframe.

3. The semiconductor component of claim 2, further including a second electrical connector having first and second ends, the second electrical connector electrically coupling the second electrical contact of the second semiconductor chip to the fifth electrically conductive tab, wherein the first end of the second electrical connector is directly coupled to the fifth electrically conductive tab.

4. The semiconductor component of claim 3, further including a third electrical connector that electrically couples the third electrical contact of the second semiconductor chip to the fourth electrically conductive tab.

5. The semiconductor component of claim 4, further including a first circuit element electrically coupled between the first electrically conductive tab and the first electrical connector.

6. The semiconductor component of claim 5, further including a second circuit element electrically coupled between the fifth electrically conductive tab and the second electrical connector.

7. The semiconductor component of claim 4, wherein the first, second, third, and fourth electrically conductive tabs are first, second, third, and fourth bond pads of a printed circuit board.

8. The semiconductor component of claim 4, wherein the first, second, and third electrical contacts of the first semiconductor chip are source, gate, and drain contacts, respectively and the first, second, and third electrical contacts of the second semiconductor chip are source, drain, and gate contacts, respectively.

9. The semiconductor component of claim 3, wherein the first end of the second electrical connector is directly coupled to the fifth electrically conductive tab using a die attach material.

10. The semiconductor component of claim 1, wherein the first electrical contact electrically is directly coupled to the first electrically conductive tab using a first die attach material and the second electrical contact electrically is directly coupled to the second electrically conductive tab using a second die attach material.

11. The semiconductor component of claim 10, wherein the first die attach material and the second die attach material are electrically and thermally conductive materials.

12. The semiconductor component of claim 1, wherein the first end of the first electrical connector is directly coupled to the third electrically conductive tab using die attach material and the second end of the first electrical connector is directly electrically coupled to the third electrical contact of the first semiconductor chip using additional die attach material.

13. The semiconductor component of claim 1, further including a bond wire, wherein the bond wire electrically couples the second electrical contact of the second semiconductor chip electrically to the fifth electrically conductive tab.

14. A method for manufacturing a semiconductor component, comprising:
    providing a support structure having a plurality of electrically conductive tabs;
    directly coupling a first electrical contact of a first semiconductor chip to a first electrically conductive tab of the plurality of electrically conductive tabs and directly coupling a second electrical contact of the first semiconductor chip to a second electrically conductive tab of the plurality of electrically conductive tabs, the first and second electrical contacts on a first side of the first semiconductor chip;
    directly coupling a first end of a first electrical connector to a third electrical contact of the first semiconductor chip and directly coupling a second end of the first electrical connector to a third electrically conductive tab of the plurality of electrically conductive tabs, the third electrical contact on a second side of the first semiconductor chip, the first side opposite the second side;
    directly coupling a first electrical contact of a second semiconductor chip to the first end of a first electrical connector; and
    electrically coupling a second electrical contact of the second semiconductor chip to a fourth electrically conductive tab of the plurality of electrically conductive tabs and a third electrical contact of the second semiconductor chip to a fifth electrically conductive tab of the plurality of electrically conductive tabs, the second and third electrical contacts of the second semiconductor chip on a first side of the second semiconductor chip and the first electrical contact of the second semiconductor chip on a second side of the second semiconductor chip.

15. The method of claim 14, further including electrically coupling a circuit element between the third electrical contact of the first semiconductor chip and the first electrically conductive tab.

16. The method of claim 14, wherein providing the support substrate includes providing the support structure as one of a leadframe or a printed circuit board.

17. The method of claim 14, wherein electrically coupling the second electrical contact of the second semiconductor chip to the fourth electrically conductive tab of the plurality of electrically conductive tabs includes:
    providing a second electrical connector having first and second ends;
    directly coupling the first end of the second electrical connector to the second electrical contact of the second semiconductor chip; and
    directly coupling the second end of the second electrical connector to the fourth electrically conductive tab of the plurality of electrically conductive tabs.

18. The method of claim 17, further including directly coupling the first end of the second electrical connector to the second electrical contact of the second semiconductor chip using a first die attach material and directly coupling the second end of the second electrical connector to the fourth electrically conductive tab of the plurality of electrically conductive tabs using a second die attach material.

19. The method of claim 17, wherein electrically coupling the third electrical contact of the second semiconductor chip to the fifth electrically conductive tab of the plurality of electrically conductive tabs includes:
    providing a third electrical connector having first and second ends;
    directly coupling the first end of the third electrical connector to the third electrical contact of the second semiconductor chip; and
    directly coupling the second end of the third electrical connector to the fifth electrically conductive tab of the plurality of electrically conductive tabs.

20. The method of claim 19, further including directly coupling the first end of the third electrical connector to the third electrical contact of the second semiconductor chip using a first die attach material and directly coupling the second end of the third electrical connector to the fifth electrically conductive tab of the plurality of electrically conductive tabs using a second die attach material.

21. The method of claim 17, further including using a bond wire to electrically couple the third electrical contact of the second semiconductor chip to the fifth electrically conductive tab of the plurality of electrically conductive tabs.

* * * * *